United States Patent
Choe et al.

(10) Patent No.: US 12,266,710 B2
(45) Date of Patent: Apr. 1, 2025

(54) THIN FILM STRUCTURE, SEMICONDUCTOR DEVICE INCLUDING THE SAME, AND SEMICONDUCTOR APPARATUS INCLUDING SEMICONDUCTOR DEVICE

(71) Applicant: Samsung Electronics Co., Ltd., Suwon-si (KR)

(72) Inventors: Dukhyun Choe, Suwon-si (KR); Jinseong Heo, Seoul (KR); Taehwan Moon, Suwon-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 508 days.

(21) Appl. No.: 17/518,015

(22) Filed: Nov. 3, 2021

(65) Prior Publication Data

US 2022/0393016 A1    Dec. 8, 2022

(30) Foreign Application Priority Data

Jun. 4, 2021    (KR) .................. 10-2021-0072980

(51) Int. Cl.
*H01L 29/78*     (2006.01)
*H01L 29/423*    (2006.01)
(Continued)

(52) U.S. Cl.
CPC ...... *H01L 29/516* (2013.01); *H01L 29/42392* (2013.01); *H01L 29/78391* (2014.09); *H01L 29/78618* (2013.01)

(58) Field of Classification Search
CPC ............. H01L 29/516; H01L 29/42392; H01L 29/78391; H01L 29/78618; H01L 29/1083;
(Continued)

(56) References Cited

U.S. PATENT DOCUMENTS 5,621,681 A * 4/1997 Moon .................. H10B 53/00
                                                    257/295
8,877,520 B2   11/2014 Kijima et al.
(Continued)

FOREIGN PATENT DOCUMENTS

JP    2005-135974 A    5/2005
JP    2011-029399 A    2/2011
(Continued)

OTHER PUBLICATIONS

Tao et al: "Improved subthreshold swing of MoS2 negative-capacitance transistor by fluorine-plasma treatment on ferroelectric gate dielectric", *Institute of Physics Publishing* (Mar. 4, 2021) DOI: 10.1088/1361-6528/ABEOE3.
(Continued)

*Primary Examiner* — Sheikh Maruf
(74) *Attorney, Agent, or Firm* — Harness, Dickey & Pierce, P.L.C.

(57) ABSTRACT

Provided are a thin film structure, a semiconductor device including the thin film structure, and a semiconductor apparatus including the semiconductor device. The thin film structure includes a substrate, and a ferroelectric layer on the substrate. The ferroelectric layer includes a compound having fluorite structure, in which a <001> crystal direction is aligned in a normal direction of a substrate, and having an orthorhombic phase and including fluorine. The ferroelectric layer may have ferroelectricity.

25 Claims, 15 Drawing Sheets

(51) Int. Cl.
*H01L 29/51* (2006.01)
*H01L 29/786* (2006.01)

(58) Field of Classification Search
CPC ......... H01L 29/78681; H01L 29/78696; H01L 29/513; H01L 29/778; H01L 29/785; H01L 28/40; H01L 29/40111; H01L 29/6684; H01L 28/56; H10B 53/30
USPC ........................................................ 257/288
See application file for complete search history.

(56) References Cited

U.S. PATENT DOCUMENTS

| | | | | |
|---|---|---|---|---|
| 2004/0112870 | A1* | 6/2004 | Lee | C04B 41/5315 216/104 |
| 2006/0141703 | A1* | 6/2006 | Kang | B82Y 10/00 438/780 |
| 2006/0157691 | A1* | 7/2006 | Lee | G11C 13/0014 257/306 |
| 2006/0175653 | A1* | 8/2006 | Joo | B82Y 10/00 257/314 |
| 2006/0208248 | A1* | 9/2006 | Lee | H10N 70/245 257/632 |
| 2007/0221986 | A1* | 9/2007 | Kang | H10B 63/00 977/773 |
| 2007/0278481 | A1* | 12/2007 | Lee | B82Y 10/00 257/E51.001 |
| 2008/0248330 | A1* | 10/2008 | Joo | C07C 211/54 564/305 |
| 2013/0192878 | A1* | 8/2013 | Kijima | H10N 30/078 427/126.3 |
| 2014/0070289 | A1* | 3/2014 | Tanaka | H10B 51/30 257/295 |
| 2014/0070290 | A1* | 3/2014 | Inumiya | H10B 51/20 257/295 |
| 2015/0183190 | A1* | 7/2015 | Kijima | H10N 30/10516 423/598 |
| 2016/0005961 | A1* | 1/2016 | Ino | H10N 70/231 257/295 |
| 2016/0308070 | A1* | 10/2016 | Chang | H10B 51/30 |
| 2017/0103988 | A1* | 4/2017 | Nishida | H01L 29/6684 |
| 2017/0162702 | A1* | 6/2017 | Hu | H01L 29/42384 |
| 2018/0166582 | A1* | 6/2018 | Liao | H10B 51/30 |
| 2019/0074295 | A1* | 3/2019 | Schröder | H01L 28/40 |
| 2019/0198617 | A1* | 6/2019 | Li | H01L 29/40111 |
| 2019/0198673 | A1* | 6/2019 | Liu | H01L 29/516 |
| 2019/0355584 | A1* | 11/2019 | Yamaguchi | G11C 11/2275 |
| 2020/0105770 | A1* | 4/2020 | Yoo | G11C 11/221 |
| 2020/0105897 | A1* | 4/2020 | Hsu | H01L 29/516 |
| 2021/0005728 | A1* | 1/2021 | Cheng | H01L 29/517 |
| 2021/0028180 | A1* | 1/2021 | Yamaguchi | H10B 51/00 |
| 2021/0272970 | A1* | 9/2021 | Lee | G11C 11/2259 |
| 2021/0280720 | A1* | 9/2021 | Lee | H10B 51/40 |
| 2021/0399135 | A1* | 12/2021 | Polakowski | H10B 53/30 |
| 2022/0140147 | A1 | 5/2022 | Choe et al. | |
| 2022/0208990 | A1* | 6/2022 | Young | H01L 29/66795 |
| 2022/0344359 | A1* | 10/2022 | Ali | H01L 28/60 |

FOREIGN PATENT DOCUMENTS

| | | |
|---|---|---|
| JP | 5891490 B2 | 3/2016 |
| JP | 6661197 B2 | 3/2020 |
| KR | 10-2011-0078180 A | 7/2011 |
| KR | 10-2022-0060450 A | 5/2022 |

OTHER PUBLICATIONS

Lederer et al: "Local crystallographic phase detection and texture mapping in ferroelectric Zr doped Hf02films by transmission-EBSDrr," *American Institute of Physics*, vol. 115, No. 22, (Nov. 27, 2019-11) DOI: 10.1063/1.5129318.

EESR dated Oct. 24, 2022 for corresponding EP Patent Application No. 22176154.7.

Wenjuan Lu, et al. "A first-principles study of interfacial fluorination at the HfO2/Al2O3 interface in charge trapping memory devices," Journal of Applied Physics, No. 125, pp. 215303-215303-9 (2019).

Bendjedid A. et al: "Structural, electronic, bonding and thermoelastic properties of orthorhombic and cubic CeO 2 compound", Chinese Journal of Physics., vol. 54, No. 1, Feb. 1, 2016 (Feb. 1, 2016), pp. 1-11, XP093194302, CN ISSN: 0577-9073, DOI: 10.1016/j.cjph.2016.02.001.

Gerward L et al: "Bulk modulus of CeO"2 and PrO"2—An experimental and theoretical study", Journal of Alloys and Compounds, Elsevier Sequoia, Lausanne, CH, vol. 400, No. 1-2, Sep. 1, 2005 (Sep. 1, 2005), pp. 56-61, XP025330498, ISSN: 0925-8388, DOI: 10.1016/J.JALLCOM.2005.04.008 [retrieved on 200.

European Office Action dated Aug. 16, 2024 issued in European Application No. 22 176 154.7-1211.

* cited by examiner

ORTHORHOMBIC

P ≠ 0

THIN FILM STRUCTURE, SEMICONDUCTOR DEVICE INCLUDING THE SAME, AND SEMICONDUCTOR APPARATUS INCLUDING SEMICONDUCTOR DEVICE

CROSS-REFERENCE TO RELATED APPLICATION

This application is based on and claims priority under 35 U.S.C. § 119 to Korean Patent Application No. 10-2021-0072980, filed on Jun. 4, 2021, in the Korean Intellectual Property Office, the disclosure of which is incorporated by reference herein in its entirety.

BACKGROUND

Some example embodiments relate to a thin film structure, a semiconductor device including the thin film structure, and/or a semiconductor apparatus including the semiconductor device.

To meet an increasing demand/desire for small and light-weight electronic products, highly-integrated semiconductor devices are generally required. However, silicon-based electronic devices of the related art have had limitations in improving their operating characteristics and reducing their sizes. For example, a subthreshold swing (SS) in measurement of an operating voltage and current characteristics of a silicon-based logic transistor may be limited to about 60 mV/dec. In this regard, as a size of the logic transistor decreases, the operating voltage may not be lowered to about 0.8 V or less, and as a power density increases, miniaturization of the logic transistor may be limited.

Therefore, various forms of a semiconductor device, for example, a semiconductor device including a ferroelectric layer, have been proposed.

SUMMARY

Provided are a thin film structure including a ferroelectric layer, of which ferroelectricity and stability are simultaneously secured or more secured; a semiconductor device including the ferroelectric layer; and/or a semiconductor apparatus including the semiconductor device.

Additional aspects will be set forth in part in the description which follows and, in part, will be apparent from the description, or may be learned by practice of example embodiments of the disclosure.

According to some example embodiments, a thin film structure includes a substrate and a ferroelectric layer on the substrate and including a compound having fluorite structure in which a <001> crystal direction is aligned along a normal direction of the substrate, the compound having a fluorite structure having an orthorhombic phase and including fluorine.

The ferroelectric layer may include the compound in a dominant ratio in the ferroelectric layer.

The ferroelectric layer may include the compound having fluorite structure in an amount of about 20 weight % or more in the ferroelectric layer.

The ferroelectric layer may have ferroelectricity.

An amount of the orthorhombic phase in the total compound having fluorite structure may be at least about 50%.

The ferroelectric layer may include a compound having fluorite structure represented by Formula 1:

 Formula 1

In Formula 1, M is Hf, Zr, or a combination of Hf or Zr, X is O, N, H, or a combination of O, N, or H, and $0<\alpha\leq1$ and $0\leq\beta\leq1$, wherein the sum of $\alpha$ and $\beta$ is about 1 or less.

The ferroelectric layer may further include a dopant material selected from the group including C, Si, Ge, Sn, Pb, Al, Y, La, Gd, Mg, Ca, Sr, Ba, Ti.

The ferroelectric layer may include the compound having fluorite structure represented by Formula 1, wherein an amount of the dopant material is in a range of greater than 0 atom % (at %) to about 20 at % or less of an amount of M.

A thickness of the ferroelectric layer may be in a range of about 0.1 nm or more to about 10 nm or less.

The ferroelectric layer may include a first region and a second region, wherein the first region includes a first compound having fluorite structure represented by Formula 1-1; and the second region includes a second compound having fluorite structure represented by Formula 1-2:

 Formula 1-1

 Formula 1-2

In Formulae 1-1 and 1-2,
M is Hf, Zr, or a combination of Hf and Zr;
X is O, N, H, or a combination of O, N, or H;
$0<\gamma1\leq1$ and $0\leq\gamma2\leq1$, wherein the sum of $\gamma1$ and $\gamma2$ is about 1 or less;
$0\leq\delta1\leq1$ and $0\leq\delta2\leq1$, wherein the sum of $\delta1$ and $\delta2$ is about 1 or less; and
$\gamma1$ and $\delta1$ are different from each other.
In Formulae 1-1 and 1-2, $\gamma1>\delta1$.
In Formulae 1-1 and 1-2, $\delta1$ may be about 0.1 or less, and $\gamma1$ may be in a range of about 0.1 or more to about 0.95 or less.

The second region may be located between the substrate and the first region and/or the first region may be located between the substrate and the second region.

According to some example embodiments, a semiconductor device includes the thin film structure.

The semiconductor device may be or may include a capacitor or a field-effect transistor.

According to some example embodiments, a transistor may include a substrate, a source/drain region on the substrate, and a ferroelectric layer on the substrate between the source/drain region. The ferroelectric layer includes comprising a fluorine compound in an orthorhombic phase, the fluorine compound being a compound in which a <001> crystal direction is aligned along a normal direction of the substrate.

The transistor may include a halo region in the substrate, the halo region having a conductivity type opposite to a conductivity type of the source/drain region.

A concentration of impurities in the halo region is less than a concentration of impurities in the source/drain region.

The transistor may further include a gate electrode on the ferroelectric layer. A thickness of the gate electrode may be less than a thickness of the ferroelectric layer.

The gate electrode may be directly on the ferroelectric layer, and the ferroelectric layer may be directly on the substrate.

BRIEF DESCRIPTION OF THE DRAWINGS

The above and other aspects, features, and advantages of some example embodiments will be more apparent from the following description taken in conjunction with the accompanying drawings, in which.

DETAILED DESCRIPTION

Figure 1:
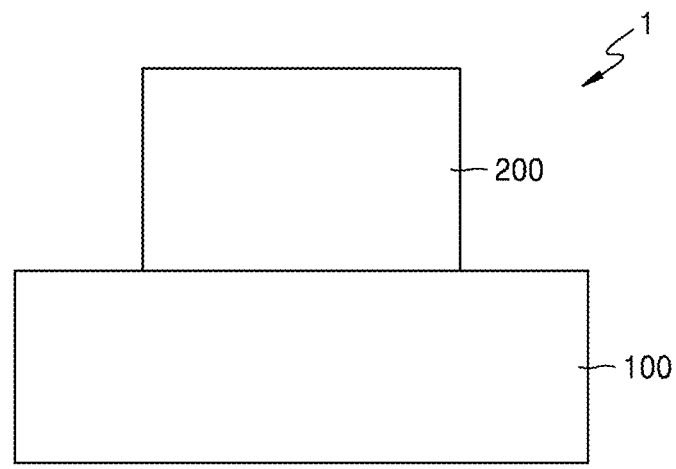
FIG. 1 is a schematic view of a thin film structure according to some example embodiments.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe specific embodiments and are not intended to limit the technical concept. It will be understood that an expression such as "above" or "on" may include not only the meaning of "immediately on, under, to the left, or to the right in a contact manner", but also the meaning of "on, under, to the left, or to the right in a non-contact manner".

A singular expression includes a plural expression unless a description to the contrary is specifically pointed out in context. In the present specification, unless particularly described otherwise, it should be understood that the terms such as "include" or "have" are merely intended to indicate that features, numbers, steps, operations, elements, parts, components, or combinations thereof are present, and are not intended to exclude the possibility that one or more other features, numbers, steps, operations, elements, parts, components, or combinations thereof will be present or added.

While such terms as "first," "second," or "third" may be used to describe various components, the terms are only used to distinguish one component from another, and orders or types of such components must not be limited.

The terms such as "unit", "means", and "unit" used in the specification refer to a unit of a comprehensive configuration that performs at least one function or operation, and, for example, may be implemented as hardware, software, or a combination of hardware and software.

Hereinafter, example embodiments will be described in detail with reference to the accompanying drawings. In the following drawings, like reference numerals refer to like elements, and the size of each element (a width and/or thickness of a layer and/or region) in the drawings may be exaggerated for clarity and convenience of explanation. Various embodiments described below are merely examples, and various modifications are possible.

[Thin Film Structure]

Ferroelectrics refer to materials having spontaneous polarization by aligning their internal electric dipole moments without an external electric field. In a ferroelectric, switching of dipole directions may occur by or because of or based on an external electric field.

When a ferroelectric is applied to a gate stack of a field-effect transistor, the field-effect transistor may have negative capacitance in a particular operating region, and this characteristic may contribute to low-power operation of a semiconductor device when a ferroelectric is used in the semiconductor device. For example, when a ferroelectric is applied to a transistor, a sub-threshold swing value may be lowered to about 60 mV/dec or less.

In recent years, it has been known that a compound having fluorite structure such as a hafnium-based oxide may exhibit ferroelectricity in an orthorhombic phase. A hafnium-based oxide is eco-friendly/environmentally friendly to semiconductor processes and has ferroelectric properties even in a very thin film having a thickness of several nanometers or less and thus may be useful for miniaturization of a semiconductor device.

As used herein, the terms "fluorite-type structure" or "fluorite structure" may refer to a common motif for certain compounds with the formula MX2, where X ions occupy eight tetrahedral interstitial sites and M ions occupy the regular sites of a face-centered cubic (FCC) structure. A fluorite-type structure or a fluorite structure does not necessarily include fluorine, and the term "fluorite-type structure" or the term "fluorite structure" refers in particular to the motif and not necessarily to the elements included therein.

Referring to FIG. 1, a thin film structure according to some example embodiments will be described. FIG. 1 is a schematic view of a thin film structure 1 according to some example embodiments.

According to some example embodiments, the thin film structure 1 may include a substrate 100 and a ferroelectric layer 200.

The thin film structure 1 may include the substrate 100 and the ferroelectric layer 200 located on, e.g. directly on, the substrate 100.

The ferroelectric layer 200 may include a compound having fluorite structure, in which a <001> crystal direction is aligned along a normal direction (perpendicular direction) of the substrate 100 or a planar surface of the substrate 100, the compound having fluorite structure having an orthorhombic phase. The compound may include fluorine.

The compound having fluorite structure such as a hafnium-based oxide may have ferroelectricity in an orthorhombic phase, and an alignment direction of the crystals may have a large effect on the ferroelectricity of the ferroelectric. For example, when an alignment direction of the compound having fluorite structure is random, an effective polarization ($P_{eff}$) to an electric field direction may be about 50%, whereas when the <001> crystal direction is aligned along a normal direction of the electrode, the spontaneous polarization direction coincides with the electric field direction, and thus an effective polarization ($P_{eff}$) to an electric field direction may be close to about 100%. Theoretically, when the <001> crystal direction is aligned along the normal direction of the electrode, the polarization values to the random, <111>, and <112> crystal directions may be increased by about 100%, 75%, and 23%, respectively.

However, an alignment direction of crystals of a compound having fluorite structure manufactured using an atomic layer deposition (ALD) method may be highly random, and a polarization value of the compound having fluorite structure randomly distributed as described above is smaller than a polarization value of a compound having fluorite structure aligned in a particular direction. Therefore, there is a need or desire to provide a compound having fluorite structure having a <001> crystal direction which may exhibit the highest polarization value.

However, stability of the compound having fluorite structure having a <001> crystal direction may be relatively lower than that of other compound having fluorite structures having a different crystal direction, which will be described with reference to FIG. 2.

Figure 2:
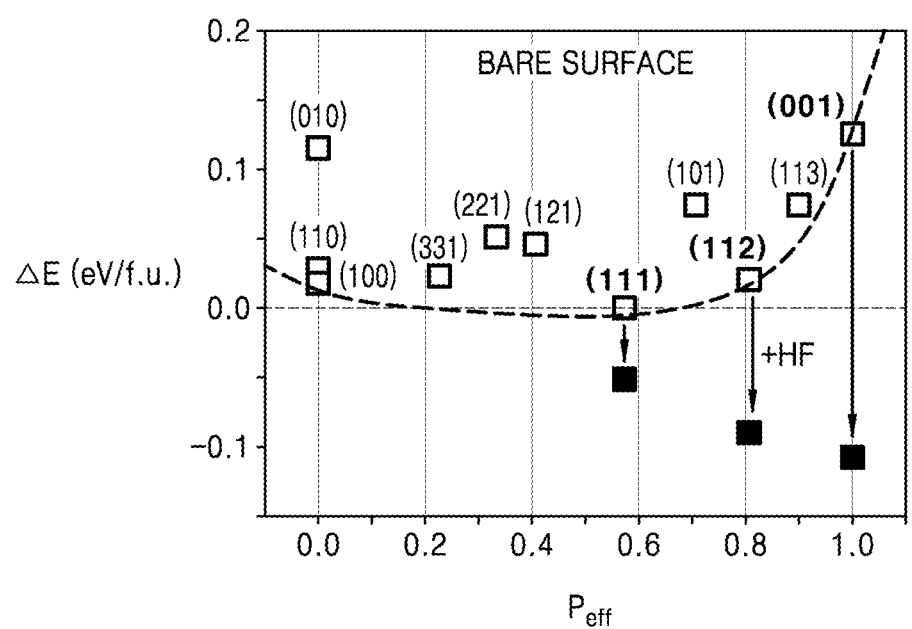
FIG. 2 is a graph of formation energies according to alignment directions of a hafnium oxide having an orthorhombic phase and formation energies according to alignment directions of a hafnium oxide including an orthorhombic phase including fluorine, calculated based on density functional theory (DFT)

FIG. 2 is a graph of formation energies according to alignment directions of a hafnium oxide having an orthorhombic phase and formation energies according to alignment directions of a hafnium oxide including an orthorhombic phase including fluorine. The formation energies are calculated based on density functional theory (DFT). In FIG. 2, <010>, <110>, <100>, <221>, <331>, <121>, <111>, <101>, <112>, <113>, and <001> represent Miller indices which indicate crystal directions of a hafnium oxide including an orthorhombic phase, and the formation energies are calculated assuming as each crystal direction aligned along the normal direction of the substrate. The open squares represent compounds having a fluorite structure wherein a ferroelectric layer is not surface treated; the closed squares represent compounds having a fluorite structure wherein the ferroelectric layer is surface treated.

Referring to FIG. 2, when a ferroelectric layer including a compound having fluorite structure is not surface-treated (open squares), a case of the <111> crystal direction aligned along the normal direction of the electrode is the most stable with a small Delta-E. On the other hand, when the <001> crystal direction is aligned along the normal direction of the electrode, the compound may be very unstable with a larger Delta-E, and thus a crystal structure in the compound may not be maintained. Thus, when a layer is not surface-treated and the <001> crystal direction is aligned along the normal direction of the electrode, spontaneous polarization characteristics of a ferroelectric may not be maintained, and durability of a semiconductor device including the ferroelectric may be significantly deteriorated.

However, referring to FIG. 2, when a ferroelectric layer including a compound having fluorite structure is surface-treated (closed squares), for example, with fluorine, stability of the <001> crystal direction having the highest effective polarization ($P_{eff}$) may increase, and thus the stability may further increase than that of the <111> or <112> crystal direction.

The thin film structure, according to some example embodiments, including the ferroelectric layer located on the substrate and including a compound having fluorite structure, in which a <001> crystal direction is aligned along a normal direction of the substrate, the compound having fluorite structure with an orthorhombic phase and including fluorine, may have high ferroelectricity and high stability at the same time.

The thin film structure may include crystals of which a <001> crystal direction is aligned along the normal direction of the substrate 100/to a surface of the substrate in a dominant ratio (the highest ratio and/or the top ratio) among the total crystals of the ferroelectric layer 200. For example, an amount of the crystals of which a <001> crystal direction is aligned along the normal direction of the substrate 100 may be about 20% or more, about 25% or more, about 30% or more, about 40% or more, about 45% or more, about 90% or less, about 85% or less, about 80% or less, about 75% or less, about 70% or less, about 65% or less, about 60% or less, or about 55% or less among the total crystals. The amount of the crystals/crystal grains of which a <001> crystal direction is aligned along the normal direction of the substrate 100 may be confirmed using a method such as x-ray diffraction and/or transmission electron microscopy and/or for example, may be confirmed by precession electron diffraction (PED), which will be later described. The thin film structure may include a compound having fluorite structure further including crystals of which a <113>, <123>, <223>, or <001> crystal direction is aligned in the normal direction of the substrate 100, in addition to the crystals of which a <001> crystal direction is aligned in the normal direction of the substrate.

The ferroelectric layer 200 may have ferroelectricity. In particular, a size of the spontaneous polarization is not limited as long as the ferroelectric layer has ferroelectricity, but the size of the spontaneous polarization may be about 1

μC/cm² or greater, about 2 μC/cm² or greater, about 3 μC/cm² or greater, about 10 μC/cm² or less, about 15 μC/cm² or less, about 20 μC/cm² or less, or about 30 μC/cm² or less.

Since the compound having fluorite structure has the orthorhombic phase in a dominant ratio (the highest ratio or the top ratio among the total crystals), physical properties of the compound having fluorite structure may be different from those of other compound having fluorite structures with a monoclinic phase, a cubic phase, or a tetragonal phase in a dominant ratio.

Figure 3A:
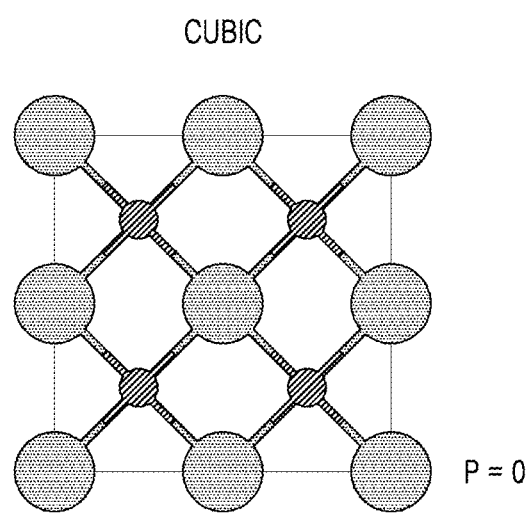
FIG. 3A is a schematic view of a compound having fluorite structure having a cubic phase in a dominant ratio.
Figure 3B:
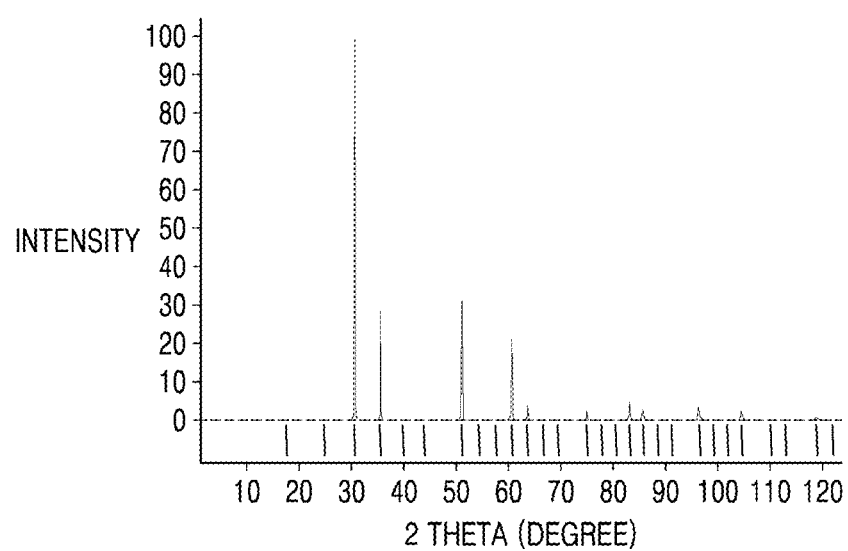
FIG. 3B is a view showing results of simulating X-ray diffraction (XRD) on the compound of fluorite structure having a cubic phase using the VESTA program by modelling an X-ray diffractometer with Cu target.
Figure 3C:
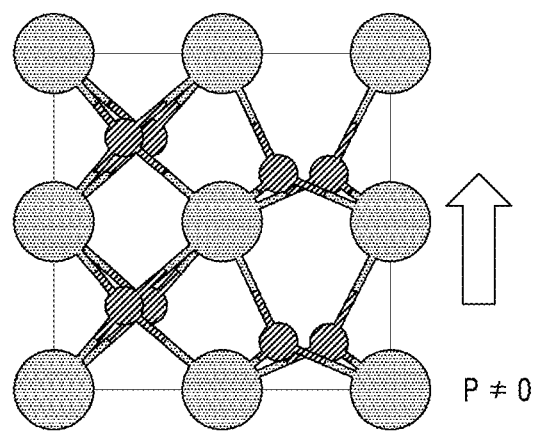
FIG. 3C is a schematic view of a compound having fluorite structure having an orthorhombic phase in a dominant ratio.
Figure 3D:
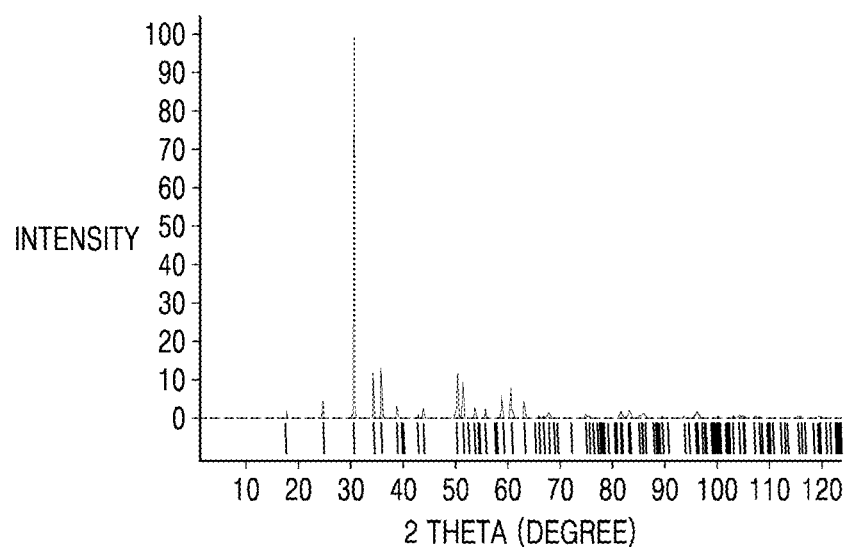
FIG. 3D is a view showing results of simulating XRD on the compound having fluorite structure having an orthorhombic phase using the VESTA program by modelling an X-ray diffractometer with Cu target.

As an example, FIG. 3A shows a schematic view of a compound having fluorite structure with a cubic phase in a dominant ratio, and FIG. 3B shows results of simulating X-ray diffraction (XRD) on the compound having fluorite structure having a cubic phase using the VESTA program by modelling an X-ray diffractometer with Cu target. Also, as an example, FIG. 3C shows a schematic view of a compound having fluorite structure having an orthorhombic phase in a dominant ratio, and FIG. 3D shows results of simulating XRD in the same manner used in the compound having fluorite structure including a cubic phase. Referring to FIGS. 3A and 3C, the compound having fluorite structure having a cubic phase in a dominant ratio does not have ferroelectricity due to symmetrical arrangement of the atoms, but the compound having fluorite structure having an orthorhombic phase in a dominant ratio may have ferroelectricity, for example due to asymmetry in the atoms.

However, the compound having fluorite structure may further include various crystal phases such as at least one of a monoclinic phase, a cubic phase, and a tetragonal phase in addition to an orthorhombic phase. For example, an amount of the orthorhombic phase may be at least about 50% of the total compound having fluorite structure. In some example embodiments, the amount of the orthorhombic phase may be about 60% or more, about 70% or more, about 80 or more, about 90% or more, about 95% or more, about 98% or more, or about 99% or more of the total compound having fluorite structure. Distribution of the crystal phases may be confirmed using a method known in the art, and, for example, the method may use transmission electron microscopy (TEM) and/or grazing incidence X-ray diffraction (GIXRD).

The ferroelectric layer 200 may include a compound having fluorite structure represented by Formula 1:

$$MO_{2-\varepsilon}F_\alpha X_\beta \qquad \text{Formula 1}$$

In Formula 1, M is Hf, Zr, or a combination thereof, X is O, N, H, or a combination thereof, $0<\alpha\le1$ and $0\le\beta\le1$, wherein the sum of α and β is about 1 or less, and $0\le\varepsilon\le1$.

For example, in Formula 1, M may be Hf.

For example, in Formula 1, X may be N, H, or a combination thereof.

For example, in Formula 1, α may be about 0.1 or greater, about 0.15 or greater, about 0.2 or greater, about 0.25 or greater, about 0.3 or greater, about 0.35 or greater, about 0.4 or greater, about 1.0 or less, about 0.95 or less, or about 0.9 or less. When M, X, α, β, and ε are within these ranges, stability of the ferroelectric layer may be relatively high.

As described above, $MO_2$ (e.g., $HfO_2$) may have formation energy of a <001> crystal direction greater than formation energy of a <111> crystal direction. However, such stability of the ferroelectric layer may change by surface control.

Figure 4A:
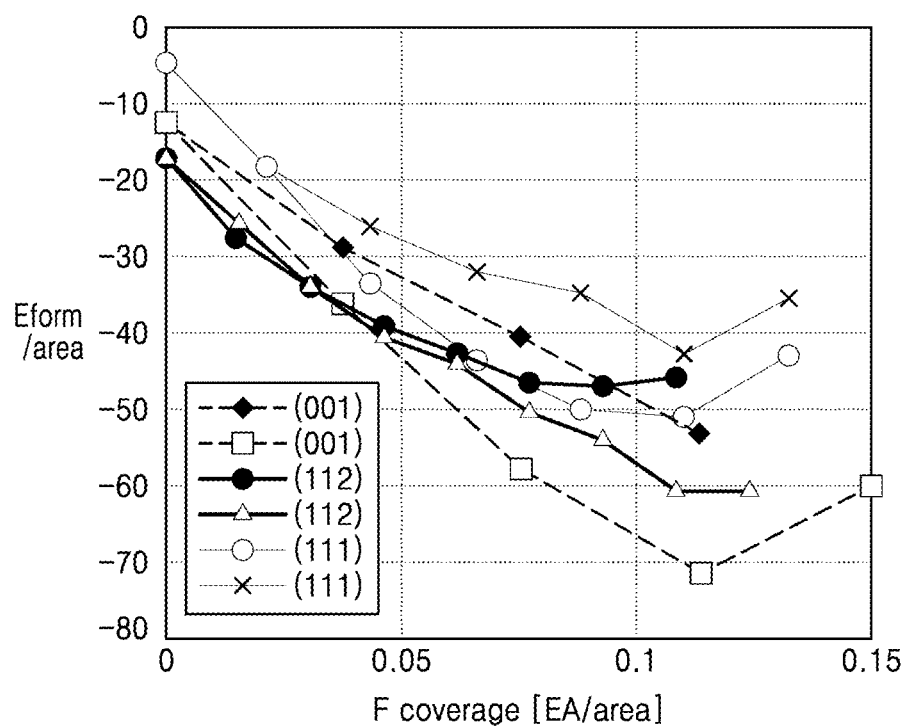
FIG. 4A is a graph of formation energy per area according to the number of F atoms per area with respect to <001>, <111>, and <112> crystal directions of a hafnium oxide having an orthorhombic phase and including fluorine, calculated based on DFT.

FIG. 4A is a graph of formation energy per area according to the number of F (fluorine) atoms per area of a hafnium oxide having an orthorhombic phase and including fluorine by treating a ferroelectric layer with fluorine, calculated based on DFT. Referring to FIG. 4A, as the number of F atoms per area increases, formation energy of the hafnium oxide is lowered, and when the number of F atoms per area is about 0.1 or greater, formation energy of a <001> crystal direction may be similar to or lower than formation energies of a <111> crystal direction and a <112> crystal direction.

Figure 4B:
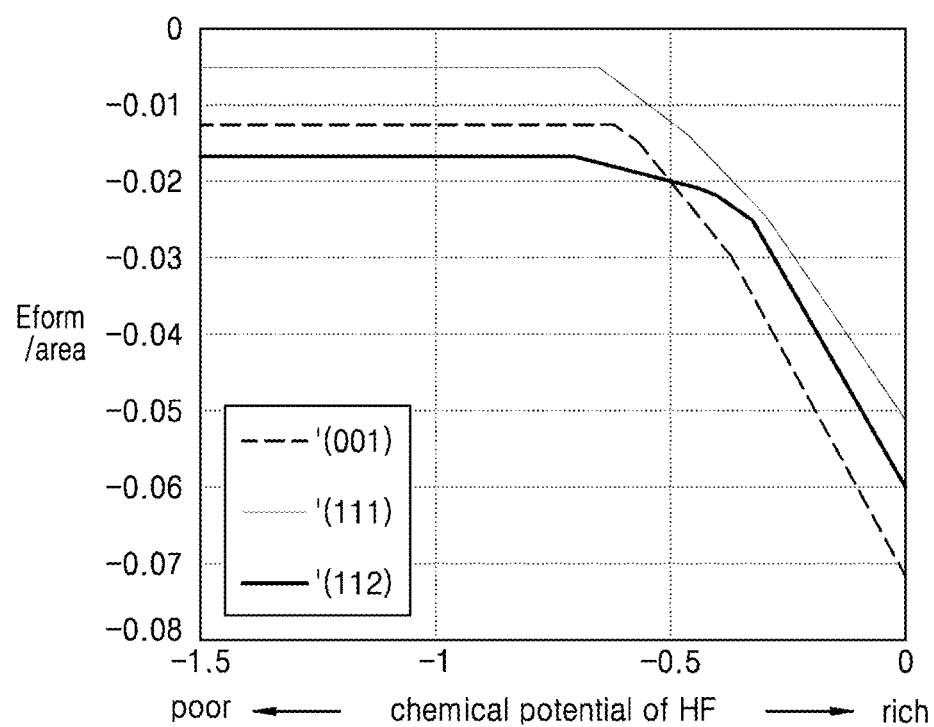
FIG. 4B is a graph of formation energy per area according to chemical energy of HF with respect to <001>, <111>, and <112> crystal directions of a hafnium oxide having an orthorhombic phase and including fluorine, calculated based on DFT.

FIG. 4B is a graph of formation energy per area according to chemical energy of HF with respect to <001>, <111>, and <112> crystal directions of a hafnium oxide having an orthorhombic phase and including fluorine, calculated based on the DFT. Referring to FIG. 4B, when chemical energy of HF in one embodiment is about −0.5 or greater, formation energy of a <001> crystal direction appeared to be lower than formation energy of a <111> crystal direction and a <112> crystal direction.

Figure 5:
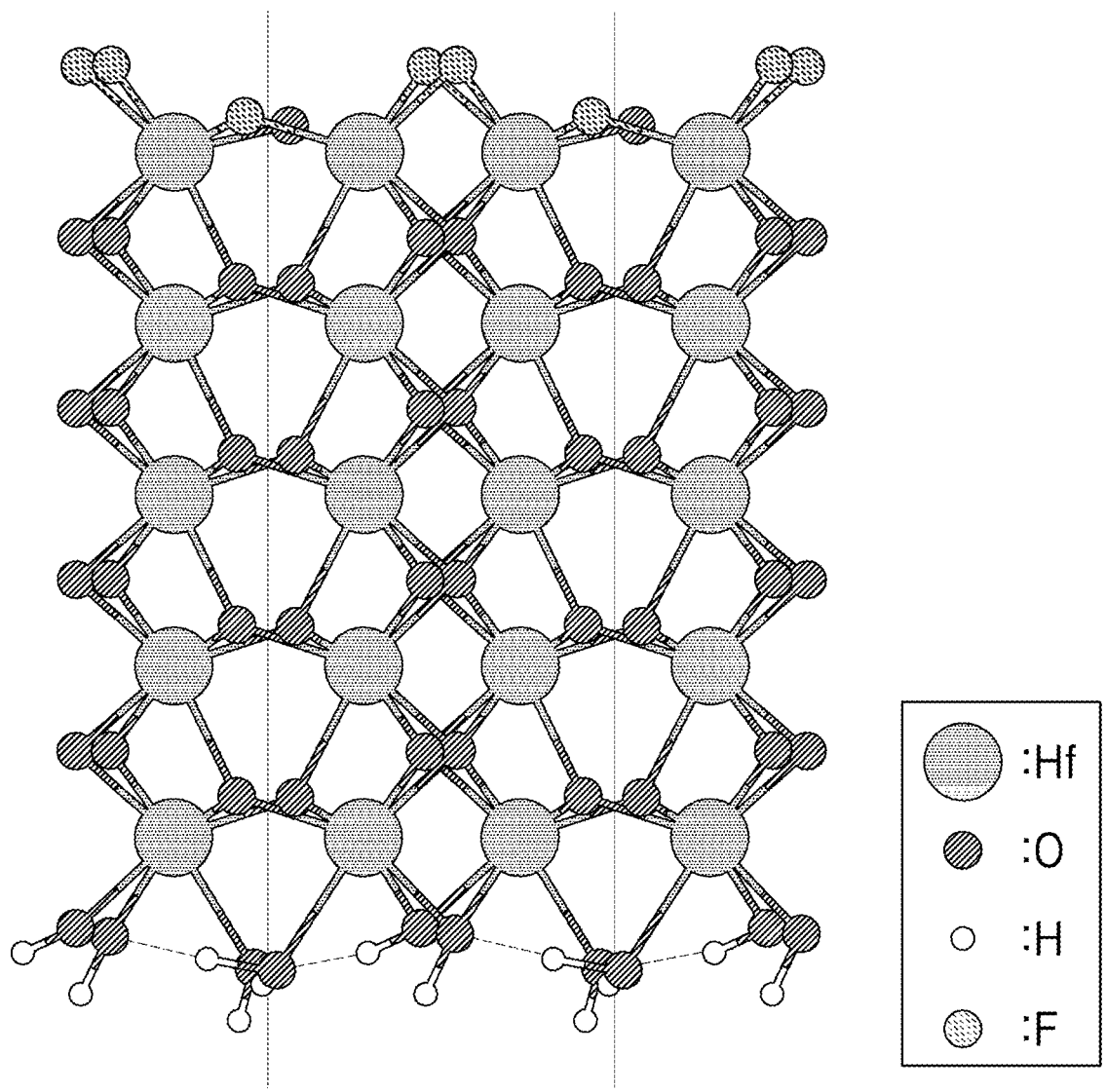
FIG. 5 is a schematic view showing a structure according to F-surface treatment of a hafnium oxide having an orthorhombic phase.

Thus, the ferroelectric layer 200 according to some example embodiments may have F instead of O in sites adjacent to M as shown in FIG. 5 by surface-treating the compound having fluorite structure having a <001> crystal direction with fluorine. Accordingly, since a ratio of F atoms in the compound having fluorite structure may be greater than 0, ferroelectricity and material stability may be secured at the same time.

Figure 6A:
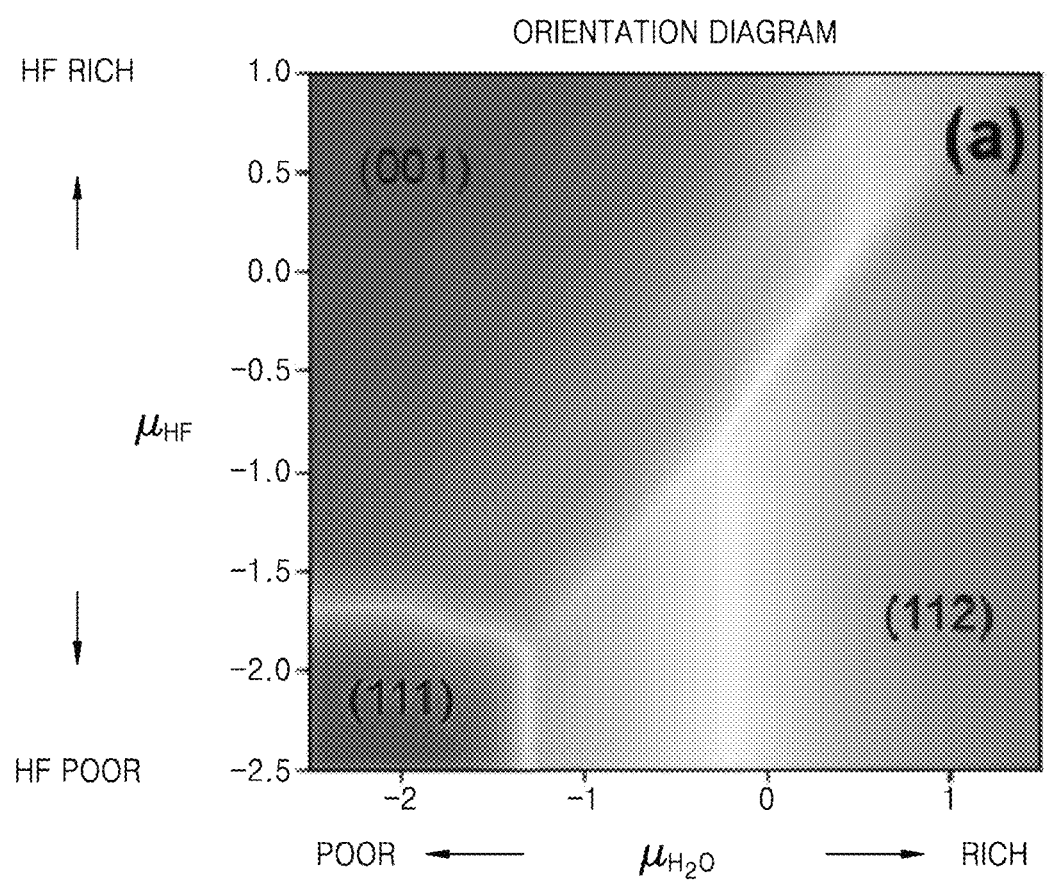
FIG. 6A shows a diagram of <001>, <111>, and <112> crystal directions according to chemical energies of HF and $H_2O$ of a hafnium oxide having an orthorhombic phase and including fluorine.

FIG. 6A shows a diagram of <001>, <111>, and <112> crystal directions according to chemical energies of HF (hydrogen fluoride) and $H_2O$ (water) of a hafnium oxide having an orthorhombic phase and including fluorine. Referring to FIG. 6A, a <001> crystal direction appears in a region where HF is rich and $H_2O$ is poor.

Figure 6A:
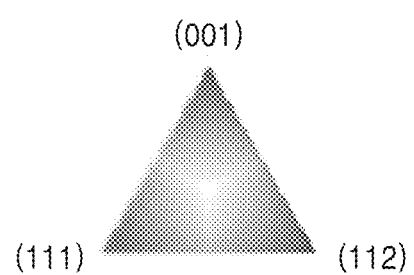
Figure 6B:
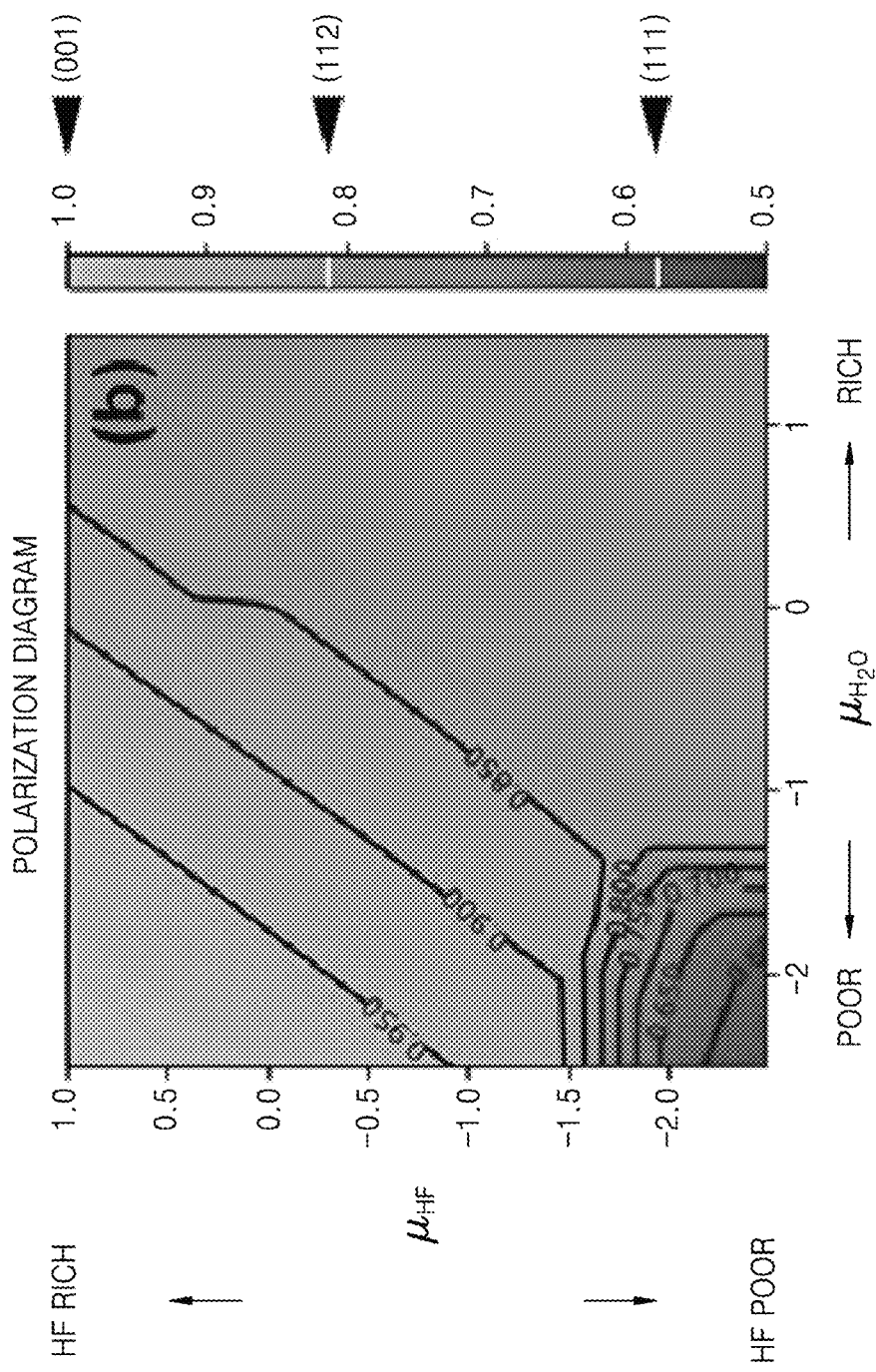
FIG. 6B shows a polarization efficiency diagram according to chemical energies of HF and $H_2O$ of a hafnium oxide having an orthorhombic phase and including fluorine.

FIG. 6B shows a polarization efficiency diagram according to chemical energies of HF and $H_2O$ of a hafnium oxide having an orthorhombic phase and including fluorine. Referring to FIG. 6B, a maximum polarization appears in a region where HF is rich and $H_2O$ is poor.

The ferroelectric layer 200 may further include a dopant material selected from the group including C, Si, Ge, Sn, Pb, Al, Y, La, Gd, Mg, Ca, Sr, Ba, Ti, and a combination thereof. For example, the ferroelectric layer 200 may include the compound having fluorite structure represented by Formula 1 as a base material and further include a dopant material selected from C, Si, Ge, Sn, Pb, Al, Y, La, Gd, Mg, Ca, Sr, Ba, Ti, and a combination thereof. An amount of the dopant material may be greater than 0 at %, about 0.2 at % or more, about 0.5 at % or more, about 1 at % or more, about 3 at % or more, about 20 at % or less, about 15 at % or less, about 12 at % or less, about 10 at % or less, about 8 at % or less, about 7 at % or less, or about 6 at % or less of a metal element (M) of the base material. The metal oxide may exhibit ferroelectricity even in a very thin film having a thickness of about several nanometers, and since the metal oxide may be applied to processes of a conventional silicon-based semiconductor device, its mass productivity may be high.

A thickness of the ferroelectric layer 200 may be in a range of greater than 0 nm to about 20 nm. For example, the thickness of the ferroelectric layer 200 may be greater than 0 nm, about 0.1 nm or more, about 0.2 nm or more, about 0.3 nm or more, about 0.4 nm or more, about 0.5 nm or more, about 0.6 nm or more, about 0.7 nm or more, about 0.8 nm or more, about 1.0 nm or more, about 1.5 nm or more, about 20 nm or less, about 18 nm or less, about 15 nm or less, about 12 nm or less, about 10 nm or less, about 8 nm or less, about 6 nm or less, about 5 nm or less, about 4 nm or less, about 3 nm or less, about 2 nm or less, or about 1 nm or less. The thickness may be measured for example, with an ellipsometer (SE MG-1000, available from Nano View); however, example embodiments are not limited thereto. In some example embodiments, the thickness of the ferroelectric layer 200 may be in a range of about 0.1 nm or more to about 10 nm or less, particularly, about 0.1 nm or more to about 5 nm. When the thickness of the ferroelectric layer 200 is within these ranges, ferroelectricity of the ferroelectric layer 200 at room temperature may be high.

The substrate 100 may include a semiconductor material. For example, the substrate 100 may include at least one of Si, Ge, SiGe, or a III-V semiconductor material and may be used in various forms such as a silicon-on-insulator (SOI).

A thin film structure 1 according to some example embodiments will be described in detail with reference to FIG. 7.

Figure 7:
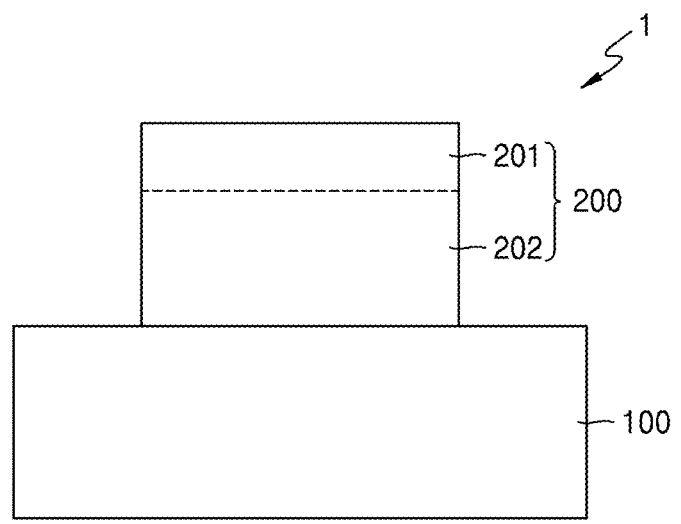
FIG. 7 is a schematic view of a thin film structure according to some example embodiments.

In the thin film structure 1 of FIG. 7, a fluorine element ratio in an inner layer of a ferroelectric layer 200 and a fluorine element ratio in at least one surface layer of the ferroelectric layer 200 may be different from each other.

For example, the ferroelectric layer 200 includes a first region 201 and a second region 202, and a fluorine element ratio in the first region and a fluorine element ratio in the second region may be different from each other. Accordingly, ferroelectricity and material stability of the ferroelectric layer 200 may be secured or more secured at the same time.

In some example embodiments, the first region 201 may include a first compound having fluorite structure represented by Formula 1-1, and the second region 202 may include a second compound having fluorite structure represented by Formula 1-2:

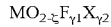  Formula 1-1

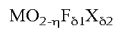  Formula 1-2

In Formulae 1-1 and 1-2, M is Hf, Zr, or a combination thereof; X is O, N, H, or a combination thereof; 0<γ1≤1 and 0γ2≤1, wherein the sum of γ1 and γ2 is about 1 or less, and 0≤ζ≤; 0≤δ1≤1 and 0≤δ2≤1, wherein the sum of δ1 and δ2 is about 1 or less, and 0≤η≤1; and γ1 and δ1 are different from each other.

In some example embodiments, in Formulae 1-1 and 1-2, γ1 and δ1 may satisfy γ1>δ1.

In some example embodiments, in Formulae 1-1 and 1-2, δ1 may be about 0.1 or less, and γ1 may be about 0.1 or greater, about 0.15 or greater, about 0.2 or greater, about 0.25 or greater, about 0.3 or greater, about 0.35 or greater, about 0.4 or greater, about 1.0 or less, or about 0.95 or less.

In some example embodiments, in Formulae 1-1 and 1-2, δ1 may be 0, and γ1 may be in a range of about 0.4 or more to about 0.95 or less.

In the ferroelectric layer 200, since a F element ratio in the second region 202, which is an inner layer, is 0, an element ratio of the compound having fluorite structure matches the stoichiometry, and thus the ferroelectricity is maintained, and since a F element ratio in the first region 201, which is at least one surface layer, is greater than 0, material stability may be secured due to a structure in which an amount of anions exceeds the stoichiometry of the compound having fluorite structure. For example, the whole ferroelectric layer 200 may be a compound expressed by $MO_2F_\alpha$ (where 0<α≤1), and the at least one surface layer may be a compound represented by $MO_2F_{\gamma1}$ (where γ1 is about 0.1 or more, about 0.15 or more, about 0.2 or more, about 0.25 or more, about 0.3 or more, about 0.35 or more, about 0.4 or more, about 1.0 or less, about 0.95 or less, or about 0.9 or less).

Although some example embodiments of having the second region 202 between the substrate 100 and the first region 201 is shown in FIG. 7 as an example, various modifications such as the first region being located between the substrate and the second region or the ferroelectric layer further including a third region including a first fluorite compound and the second region being located between the first region and the third region may be made.

[Semiconductor Device]

According to some example embodiments, a semiconductor device includes the thin film structure. The semiconductor device may be or may include a memory device or a non-memory device, for example, a field-effect transistor, a capacitor, a memristor, or a combined structure thereof, but example embodiments are not limited thereto.

Figure 8:
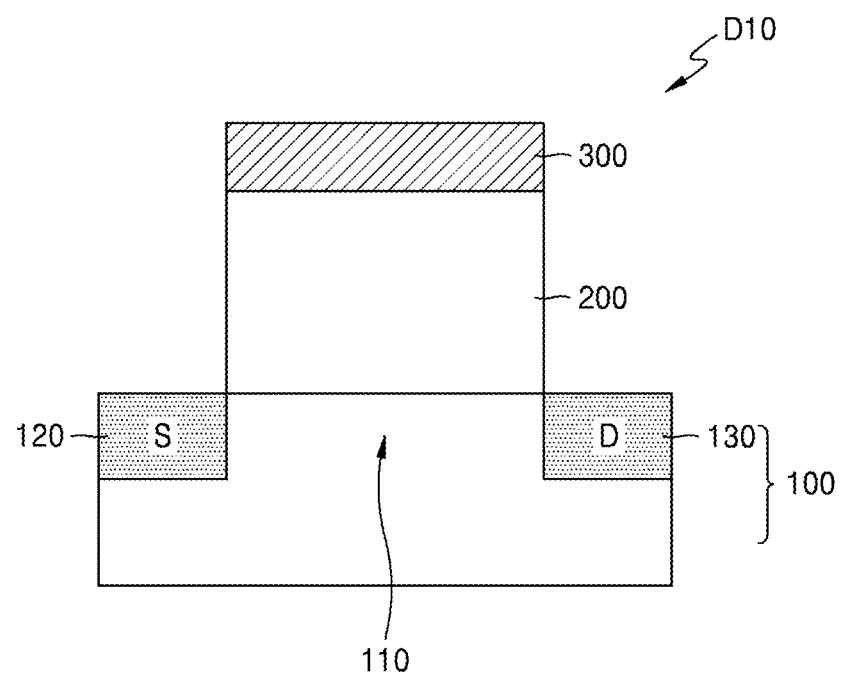
FIGS. 8 and 9 are schematic views of a semiconductor device (a field-effect transistor) according to some example embodiments.
Figure 9:
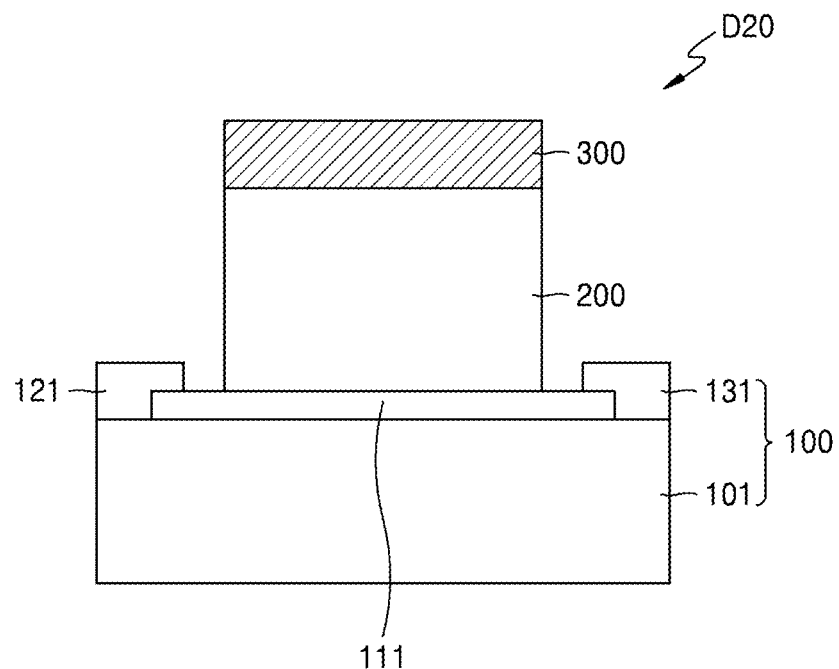

FIGS. 8 and 9 are schematic views of a field-effect transistor according to some example embodiments. Referring to FIGS. 8 and 9, a field-effect transistor D10 or D20 includes a substrate 100 including a source 120 or 121 and a drain 130 or 131; a gate electrode 300 on the substrate 100; and a ferroelectric layer 200 located between the substrate 100 and the gate electrode 300 and includes a compound having fluorite structure, in which a <001> crystal direction is aligned along a normal direction of the substrate 100, the compound having fluorite structure having an orthorhombic phase and including fluorine. The field-effect transistor D10 or D20 may be or may include a logic switching device. The logic switching device is contrast to a memory device (a memory transistor) and may have non-memory characteristics and may be an ON/OFF switching device for non-memory circuitry such as but not limited to combinatorial logic circuitry.

The substrate 100 may include a semiconductor material. For example, the substrate 100 may include at least one of Si, Ge, SiGe, or a III-V semiconductor material and may be used in various forms such as a silicon-on-insulator (SOI). The substrate 100 may have a top surface, e.g. a planar top surface, upon which a ferroelectric layer 200 sits and/or is formed.

The substrate 100 may include a source 120 or 121, a drain 130 or 131, and a channel 110 or 111 that is electrically connected to the source 120 or 121 and the drain 130 or 131. The source 120 or 121 may be electrically connected to or in contact with one end of the channel 110 or 111, and the drain 130 or 131 may be electrically connected to or in contact with another end of the channel 110 or 111.

Referring to FIG. 8, the channel 110 may be defined as a substrate region between the source 120 and the drain 130, and the channel 110 may be in the substrate 100. The source 120 and the drain 130 may be formed by implanting/injecting impurities such as at least one of boron, phosphorus, or arsenic in different regions of the substrate 100, and in this case, the source 120, the channel 110, and the drain 130 may include a substrate material as a base material.

Also, referring to FIG. 9, the channel 111 may be formed as a ferroelectric layer (thin film) separate from a substrate region 101. A material composition of the channel 111 may vary. For example, the channel 111 may include at least one selected from the group consisting of an oxide semiconductor, a nitride semiconductor, an oxynitride semiconductor, a two-dimensional (2D) material, a quantum dot, an organic semiconductor, and combinations thereof as well as a semiconductor material such as Si, Ge, SiGe, or a III-V compound. For example, the oxide semiconductor may include InGaZnO, the 2D material may include transition metal dichalcogenide (TMD) or graphene, and the quantum dot may include a colloidal quantum dot (colloidal QD) or a nanocrystal structure. Also, the source 121 and the drain 131 may be formed of a conducting material and may each independently include, for example, metal, a metal compound, or a conducting polymer.

The gate electrode 300 may be located on the substrate 100 apart from the substrate 100 facing the channel 110 or 111. The gate electrode 300 may have a conductivity of about 1 Mohm/square or less. The gate electrode 300 may include at least one selected from the group consisting of or including metal, a metal nitride film, a metal carbide, polysilicon, and combinations thereof. For example, the metal may include aluminum (Al), tungsten (W), molybdenum (Mo), titanium (Ti), or tantalum (Ta), the metal nitride film may include a titanium nitride film (TiN film) or a tantalum nitride film (TaN film), and the metal carbide may include aluminum- or silicon-doped (or containing) metal carbide, where examples of the metal carbide may include TiAlC, TaAlC, TiSiC, or TaSiC. The gate electrode 300 may have a structure in which a plurality of materials are stacked. For example, the gate electrode 300 may have a stacked structure of a metal nitride layer/metal layer such as TiN/Al or a stacked structure of a metal nitride layer/metal carbide layer/metal layer such as TiN/TiAlC/W. The gate electrode may include a titanium nitride film (TiN) or molybdenum (Mo), and the above example may be used in variously modified forms.

The ferroelectric layer 200 may be located between the substrate 100 and the gate electrode 300. In particular, the ferroelectric layer 200 may be formed on the channel 110 or 111. The ferroelectric layer 200 may refer to the description above.

Figure 10:
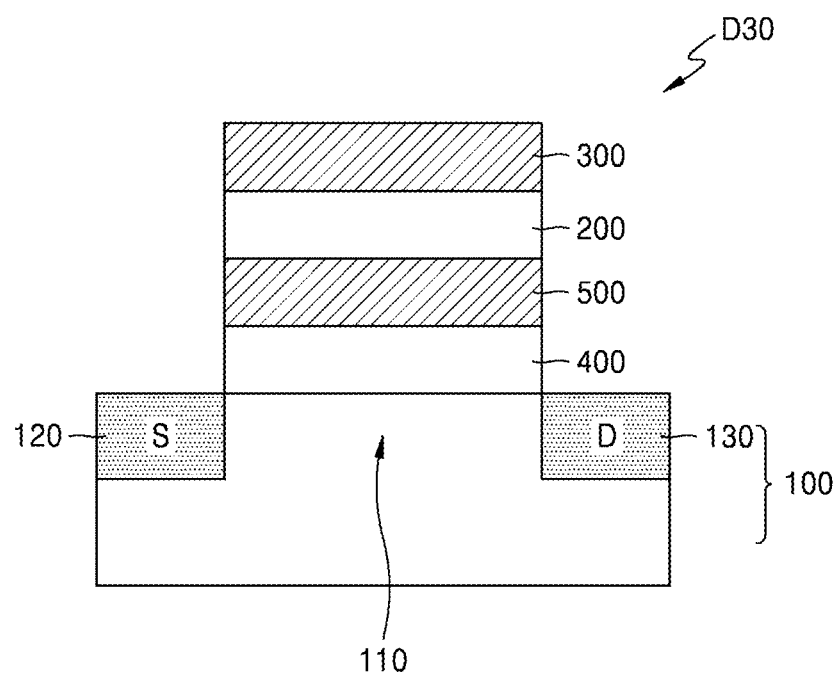
FIG. 10 is a schematic view of a semiconductor device (a field-effect transistor) according to some example embodiments.

FIG. 10 is a schematic view of a semiconductor device D30 (a field-effect transistor) according to some example embodiments. Referring to FIG. 10, a dielectric layer 400 may further be included between the channel 110 and the ferroelectric layer 200. The dielectric layer 400 may suppress or prevent or reduce the likelihood of and/or impact from electrical leakage. A thickness of the dielectric layer 400 may be about 0.1 nm or greater, about 0.3 nm or greater, or about 0.5 nm or greater, and about 5 nm or less, about 4 nm or less, about 2 nm or less, or about 1 nm or less. The dielectric layer 400 may include a paraelectric material or a high-k dielectric material. For example, the dielectric layer 400 may include at least one of silicon oxide, silicon nitride, aluminum oxide, hafnium oxide, or zirconium oxide, or a two-dimensional insulator (2D insulator) such as hexagonal boron nitride (h-BN). For example, the dielectric layer 400 may include silicon oxide ($SiO_2$) or silicon nitride ($SiN_x$). Also, the dielectric layer 400 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), or lead zinc niobate ($PbZnNbO_3$). Alternatively or additionally, the dielectric layer 400 may include metal oxynitride such as aluminum oxynitride (AlON), zirconium oxynitride (ZrON), hafnium oxynitride (HfON), lanthanum oxynitride (LaON), or yttrium oxynitride (YON); silicate such as ZrSiON, HfSiON, YSiON, or LaSiON, or aluminate such as ZrAlON or HfAlON.

Referring to FIG. 10, a conducting layer 500 may further be included between the channel 110 and the ferroelectric layer 200. The conducting layer 500 may have a conductivity of about 1 Mohm/square or less. The conducting layer 500 may be or may be a part of a floating electrode which may be formed of metal or a metal compound.

The field-effect transistor may be in various forms such as 2-dimension or 3-dimension. For example, the field-effect transistor may be a 1-gate on channel type as a planar-FET, a 3-gate on channel type as a Fin-FET, or a 4-gate on channel type as a Gate-all-around-FET.

Figure 11:
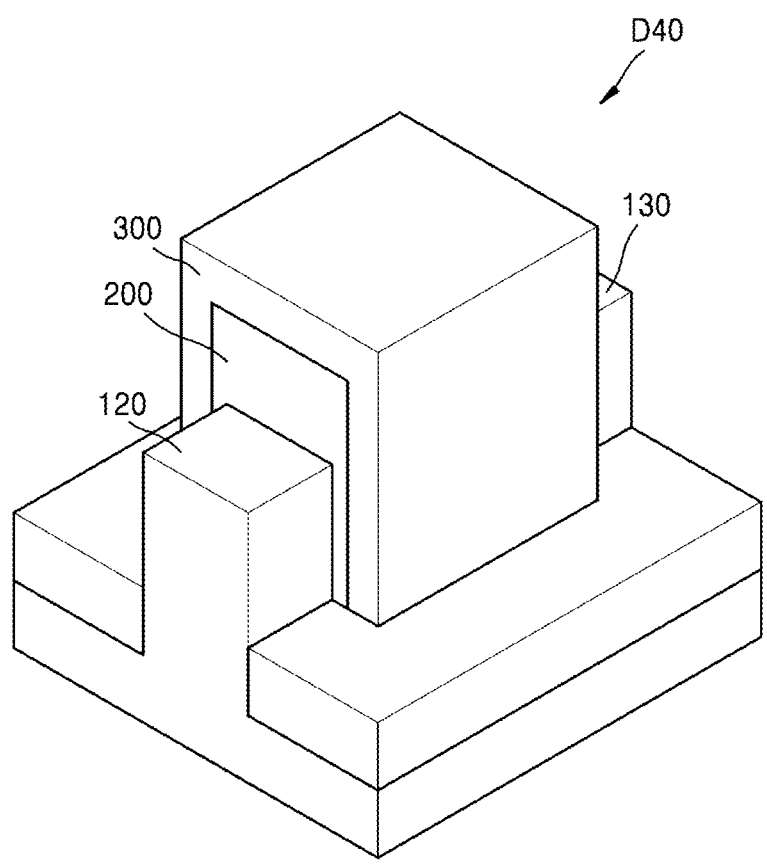
FIG. 11 is a schematic view of a semiconductor device (a field-effect transistor) according to some example embodiments.

FIG. 11 is a schematic view of a semiconductor device (particularly, a Fin-FET) according to some example embodiments. Referring to FIG. 11, a Fin-FET D40 may include a source 120; a drain 130; and a channel 110 in FIG. 4 or 111 in FIG. 5 that is defined as a region between the source 120 and the drain 130, wherein the channel 110 or 111 may have a shape of a fin. A gate electrode 300 may be located on a substrate 100 including a fin shape such that the gate electrode 300 intersect the fin shape. The channel 110 or 111 may be formed on a region where the fin shape and the gate electrode 300 intersect each other. A ferroelectric layer 200 may be located between the channel 110 or 111 and the gate electrode 300 such that the ferroelectric layer 200 surrounds the channel 110 or 111.

Figure 12:
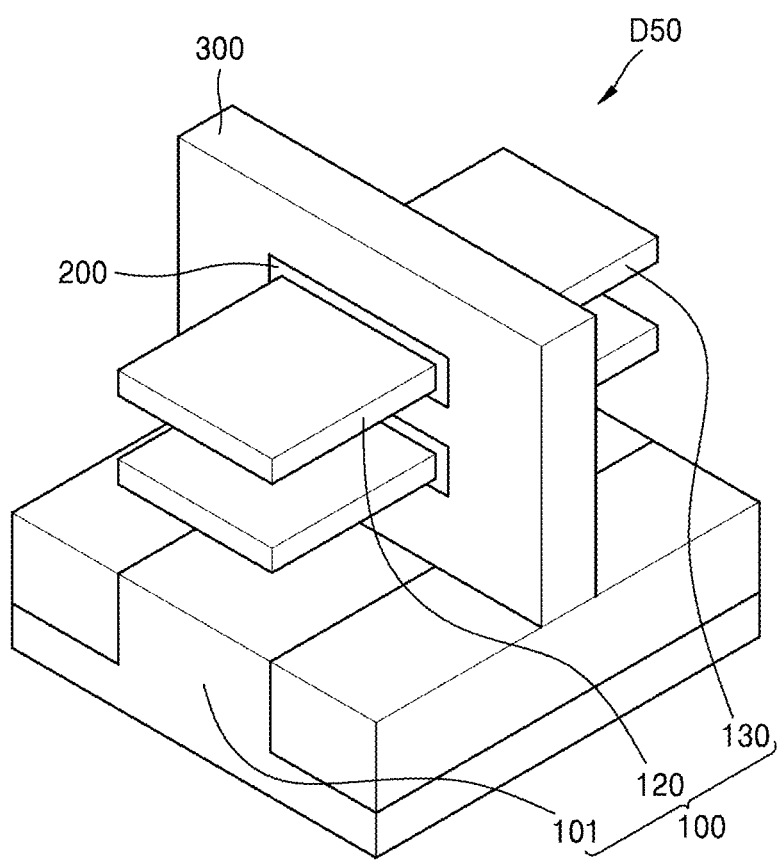
FIG. 12 is a schematic view of a semiconductor device (a gate-all-around-FET) according to some example embodiments.

FIG. 12 is a schematic view of a semiconductor device (particularly, a Gate-all-around-FET) according to some example embodiments. Referring to FIG. 12, a Gate-all-around-FET D50 includes a source 120; a drain 130; and a channel 110 in FIG. 5 or 111 in FIG. 6 that is defined as a region between the source 120 and the drain 130, wherein the channel 110 or 111 may have a shape of a wire or a sheet. The source 120, the drain 130, and the channel 110 or 111 may be located apart from a substrate region 101. A gate electrode 300 may be located to intersect the source 120, the drain 130, and the channel 110 or 111 such that the gate electrode 300 surrounds the source 120, the drain 130, and the channel 110 or 111. The channel 110 or 111 may be formed in regions where the gate electrode 300 surrounds the source 120 and the drain 130. In particular, a ferroelectric layer 200 may be located between the channel 110 or 111 and the gate electrode 300 such that the ferroelectric layer 200 surrounds the channel 110 or 111. The Gate-all-around FET D50 may be a multi-bridge channel FET (MBCFET™); however, example embodiments are not limited thereto.

Figure 13:
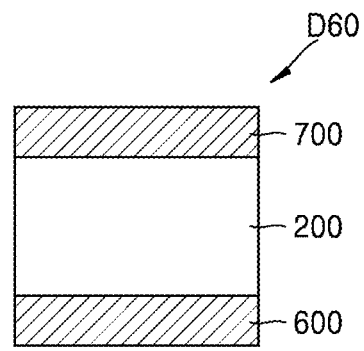
FIG. 13 is a schematic view of a semiconductor device (a capacitor) according to some example embodiments.

FIG. 13 is a schematic view of a capacitor according to some example embodiments. Referring to FIG. 13, a capacitor D60 includes a first electrode 600; a second electrode 700 facing the first electrode 600 and located apart from the first electrode; and a ferroelectric layer 200 between the first electrode 600 and the second electrode 700. The first electrode 600 and the second electrode 700 may be referred to as a lower electrode and an upper electrode, respectively.

The first electrode 600 and the second electrode 700 may have a conductivity of about 1 Mohm/square or less and may be formed of an identical material or different materials. For example, the first electrode 600 and the second electrode 700 may each independently include at least one of TiN, TaN, Ti, Ta, TiCN, TiSiN, WSiN, TiAlN, TaAlN, TiAlCN, TiW, RuTiN, RuCN, Pt, Au, Mo, or Al. For example, the first electrode 600 and the second electrode 700 may each independently include either or both of TiN or Mo. A thickness of the first electrode 600 and the second electrode 700 may be about 1 nm or greater and about 20 nm or less.

The capacitor D60 may not exhibit hysteresis behavior. In particular, a coercive electric field of the capacitor D60 in a change in polarization according to an external electric field may be about 1 MV/cm or less. The capacitor D60 may be a passive capacitor; however, example embodiments are not limited thereto.

The thin film structure and a semiconductor device including the thin film structure described above may be prepared by forming an amorphous layer including a compound having fluorite structure of a desired composition on a substrate; and annealing the resultant. Through the annealing process, the amorphous layer may be crystalized such that a <001> crystal direction is aligned along a normal direction of the substrate.

The amorphous layer may be formed using one or more various methods. For example, the amorphous layer may be formed using at least one of an atomic layer deposition (ALD) method, a chemical vapor deposition (CVD) method, a physical vapor deposition (PVD) method, or a sputtering method. Among these, when the ALD method is used, a uniform layer in an atomic unit may be formed, and the formation may be performed at a relatively low temperature.

When the amorphous layer is formed using the ALD method, precursors may be used as a hafnium source, a zirconium source, and an oxygen source. For example, as the hafnium source, at least one selected from the group consisting of or including $Hf(OtBu)_4$, tetrakis ethyl methyl amino hafnium (TEMAH), tetrakis di-methyl amino hafnium (TDMAH), tetrakis di-ethyl amino hafnium (TDEAH), and combinations thereof may be used, but embodiments are not limited thereto. For example, as the zirconium source, at least one selected from the group consisting of or including $Zr(OtBu)_4$, tetrakis ethyl methyl amino zirconium (TEMAZ), tetrakis di-methyl amino zirconium (TDMAZ), tetrakis di-ethyl amino zirconium (TDEAZ), and combinations thereof may be used, but example embodiments are not limited thereto. In addition, as the oxygen source, at least one selected from the group consisting of or including $O_3$, $H_2O$, $O_2$, $N_2O$, $O_2$ plasma, and combinations thereof may be used, but embodiments are not limited thereto.

In the annealing process, process variables such as temperature, time, and atmosphere need to be or are desired to be controlled so that the <001> crystal direction is aligned along the normal direction of the substrate as the amorphous layer including the compound having fluorite structure is crystalized to have an orthorhombic crystal phase. A thermal budget of the annealing process may be determined in consideration of a composition and/or a thickness of the amorphous layer including the compound having fluorite structure. In particular, the annealing process may be performed in at least two steps. For example, the annealing process may include a post deposition annealing process of performing first annealing on the amorphous layer, a process of forming an electrode on the amorphous layer, and a post Metal annealing process of performing second annealing on the amorphous layer and the electrode.

The annealing process may be performed at a temperature in a range of about 400° C. to about 1100° C., but example embodiments are not limited thereto. The annealing process may be performed for about 1 nano-second or more, about 1 micro-second or more, about 0.001 seconds or more, about 0.01 seconds or more, about 0.05 seconds or more, about 0.1 seconds or more, about 0.5 seconds or more, about 1 second or more, about 3 seconds or more, or about 5 seconds or more, and about 10 minutes or less, about 5 minutes or less, about 1 minute or less, or about 30 seconds or less, but example embodiments are not limited thereto. For example, the first annealing process may be performed at a temperature lower than that of the second annealing process or may be performed in a time period shorter than that of the second annealing process. The atmosphere of the annealing process is not particularly limited. For example, the first annealing process may be performed in at least one of a $F_2$, HF, and/or $NH_4F$ atmosphere.

The capacitor and the field-effect transistor may be prepared using the method of preparing a thin film structure described above. In particular, the capacitor may be prepared using a substrate including a first electrode having conductivity, forming an amorphous layer including a compound having fluorite structure on the substrate as described above, performing a first annealing (post deposition annealing) process, forming a second electrode thereon, and performing a second annealing (post metal annealing) process. The field-effect transistor may be prepared in the similar manner as in the preparation method of the capacitor described above, except that a substrate including a semiconductor material is used, and a gate electrode is formed instead of the second electrode. The preparation of the field-effect transistor may further include a process of forming a dielectric layer on the substrate including a semiconductor material and may also further include a process of forming a source and a drain on the substrate including a semiconductor material.

[Semiconductor Apparatus]

According to an aspect of some example embodiments, a semiconductor apparatus includes the thin film structure and/or the semiconductor device described above. The semiconductor apparatus may include a plurality of semiconductor devices, and a field-effect transistor and a capacitor may be electrically connected in the semiconductor apparatus. The semiconductor apparatus may have memory characteristics, and an example of the semiconductor apparatus may be DRAM. The semiconductor apparatus may have or may include other passive and/or active components.

Figure 14:
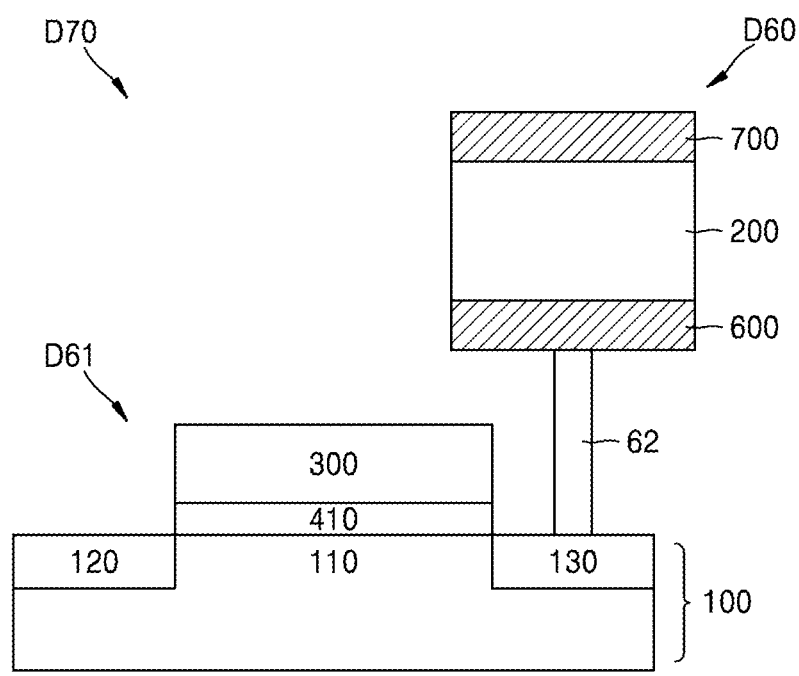
FIG. 14 is a schematic view of a semiconductor apparatus (a structure in which a capacitor and a FET are connected) according to some example embodiments.

FIG. 14 is a schematic view of a semiconductor apparatus (a structure in which a capacitor and a field-effect transistor are connected) according to some example embodiments. Referring to FIG. 14, in a semiconductor apparatus D70, a capacitor D60 including a ferroelectric layer 200 is electrically connected to a field-effect transistor D61 through a contact 62. For example, one of electrodes 600 and 700 of the capacitor D60 and one of a source and a drain 120 and 130 of the field-effect transistor D61 are electrically connected by the contact 62. The contact 62 may include an appropriate conducting material such as tungsten, copper, aluminum or polysilicon.

The field-effect transistor D61 may include a substrate 100 including a source 120, a drain 130, and a channel 110; and a gate electrode 300 facing the channel 110. A dielectric layer 410 may further be included between the substrate 100 and the gate electrode 300. The field-effect transistor D61 in FIG. 14 is shown as not including a ferroelectric layer 200, but the field-effect transistor D61 may include a field-effect transistor D61 200 as shown in FIG. 8. The source 120, the drain 130, the channel 110, the substrate 100, and the gate electrode 300 are the same as described above, and the dielectric layer 410 may be referred to the description of the dielectric layer 400 described above.

Arrangement of the capacitor D60 and the field-effect transistor D61 may vary. For example, the capacitor D60 may be located on the substrate 100 or may be embedded in the substrate 100.

The semiconductor device and the semiconductor apparatus may be used in various electronic devices. In particular, the field-effect transistor, capacitor, or a combination thereof described above may be used as or used as components of a logic element and/or a memory element in various electronic devices. The semiconductor device according to one or more example embodiments may be advantageous in terms of at least one of efficiency, speed, and power consumption, and thus may meet the demands for miniaturization and integration of electronic devices. In particular, the semiconductor device and the semiconductor apparatus may be used for at least one of an arithmetic operation, program execution, or temporary data retention in electronic devices such as at least one of mobile devices, computers, laptops, sensors, network apparatus, and neuromorphic devices. The semiconductor device and the semiconductor apparatus according to one or more embodiments may be useful in electronic apparatuses in which large and continuous data transmission is performed.

Figure 15:
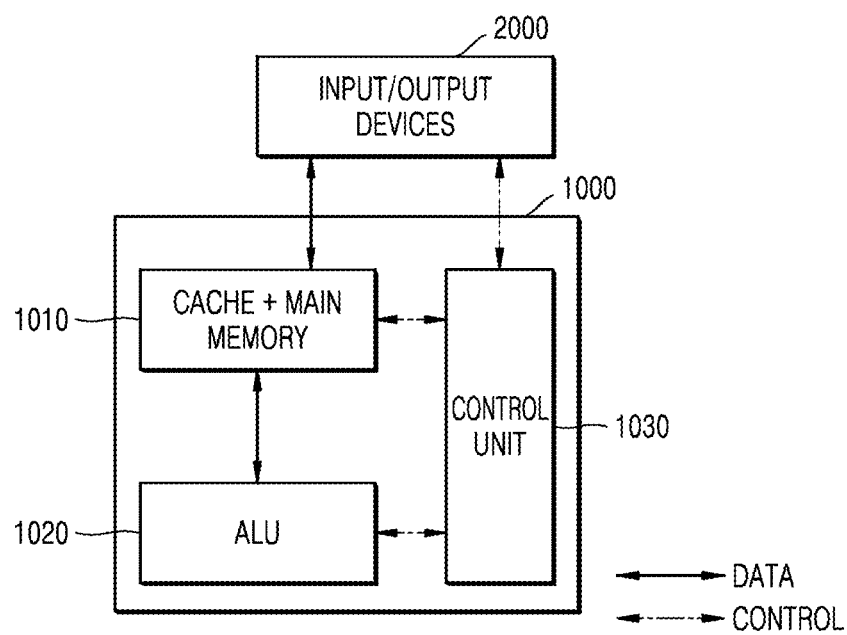
FIGS. 15 and 16 are conceptual views schematically showing an electronic device architecture applicable to an electronic apparatus, according to some example embodiments.
Figure 16:
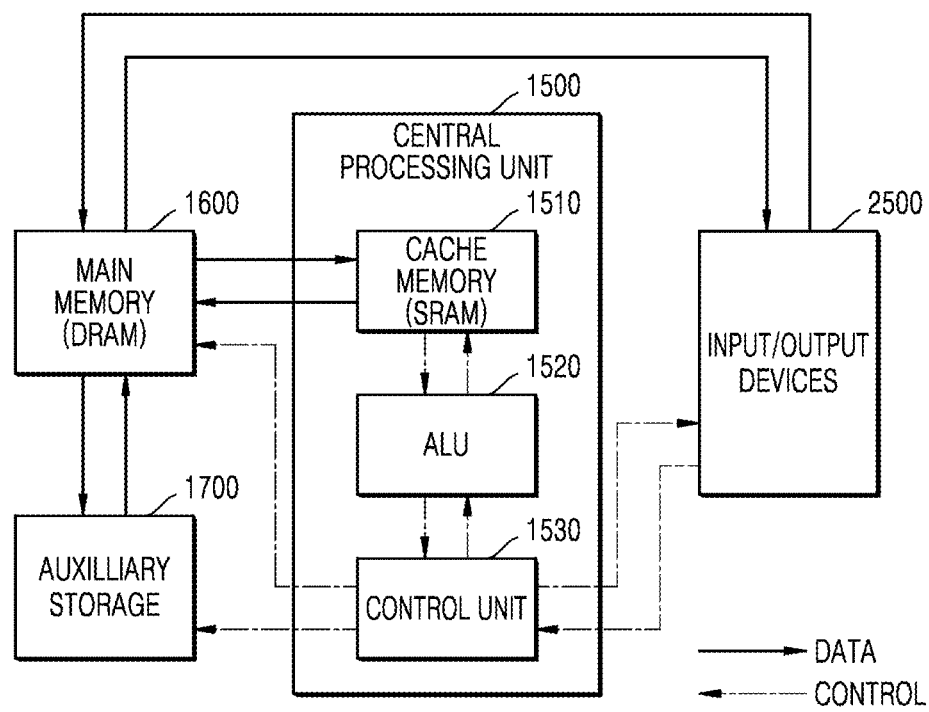

FIGS. 15 and 16 are conceptual views schematically showing an electronic device architecture applicable to an electronic apparatus according to some example embodiments.

Referring to FIG. 15, an electronic device architecture 1000 may include a memory unit 1010, an arithmetic logic unit (ALU) 1020, and a control unit 1030. The memory unit 1010, the ALU 1020, and the control unit 1030 may be electrically connected. For example, the electronic device architecture 1000 may be prepared as one chip including the memory unit 1010, the ALU 1020, and the control unit 1030. In particular, the memory unit 1010, the ALU 1020, and the control unit 1030 may be interconnected by metal lines in an on-chip and directly communicate with one another. The memory unit 1010, the ALU 1020, and the control unit 1030 may be integrated monolithically on one substrate to prepare one chip. Input/output devices 2000 may be connected to the electronic device architecture (chip) 1000.

The memory unit 1010, the ALU 1020, and the control unit 1030 may each independently include the semiconductor device (a field-effect transistor or a capacitor) described above, and may include other active and/or passive components. For example, the ALU 1020 and the control unit 1030 may each independently include the field-effect transistor described above, and the memory unit 1010 may include the capacitor, the field-effect transistor, or a combination thereof described above. The memory unit 1010 may include both a main memory and a cache memory. The electronic device architecture (chip) may be an on-chip memory processing unit.

Referring to FIG. 16, a cache memory 1510, an ALU 1520, and a control unit 1530 may constitute a central processing unit (CPU) 1500. The cache memory 1510 may be formed of or include a static random access memory (SRAM), and may include the field-effect transistor described above. Separate from the CPU 1500, a main memory 1600 and an auxiliary storage 1700 may be prepared. Alternatively or additionally, the main memory 1600 may be formed of or include a dynamic random access memory (DRAM), and may include the capacitor described above.

In some cases, the electronic device architecture may be implemented as in which computing unit devices and memory unit devices are adjacent to each other in one chip without any distinction between sub-units.

Figure 17:
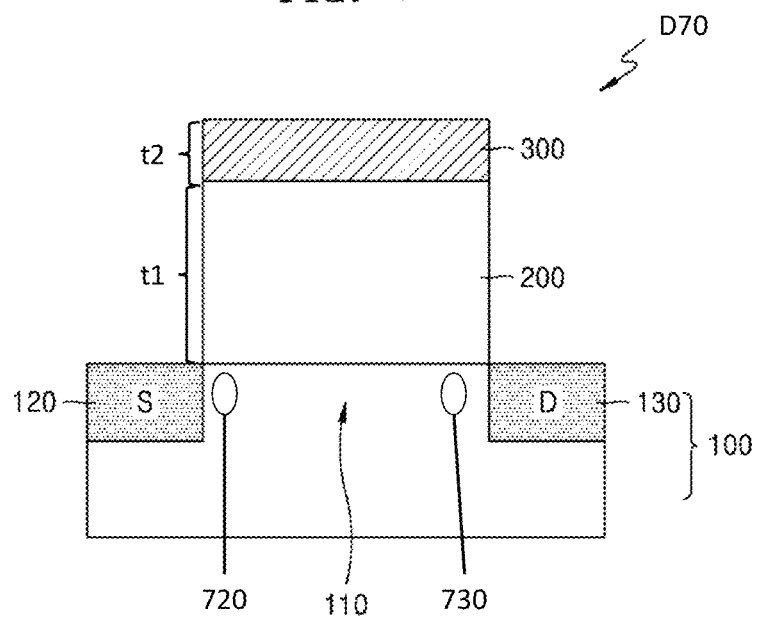
FIG. 17 is a schematic view of a semiconductor device (a field-effect transistor) according to some example embodiments.

FIG. 17 is a schematic view of a semiconductor device D70 (a field-effect transistor) according to some example embodiments. Descriptions of similar features to those of FIG. 10 are omitted for brevity.

Referring to FIG. 17, a transistor D70 may include first and second halo regions 720 and 730.

The first and second halo regions 720 and 730 may be regions of the substrate 110 that have been doped with, e.g., implanted with, impurities. The impurities included in the first and second halo regions 720 and 730 may be, or predominately be, impurities of an opposite conductivity type than that of the source region S and/or the drain region D.

A concentration of impurities in the first and second halo regions 720 and/or 730 may be less than a concentration of impurities in the source region S and/or the drain region D.

The ferroelectric layer 200 may be on, e.g., directly on, the substrate 110. The gate electrode 300 may be on, e.g., directly on, the ferroelectric layer 200.

A thickness t1 of the ferroelectric layer 200 may be greater than a thickness t2 of the gate electrode 300.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While some example embodiments have been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

Hereinafter, examples of the thin film structure and the semiconductor device described above will be described.

EXAMPLE (1) X-Ray Diffraction (XRD) Analysis

An X-ray diffractometer with Cu target was modelled, and the analysis was performed using the VESTA program.

A thin film structure including a ferroelectric layer in which improved ferroelectricity and stability are secured at the same time may be provided. A semiconductor device including the thin film structure may have an improved capacitance value and/or an improved subthreshold swing (SS) value. The thin film structure and the semiconductor device may be applied to various electronic apparatuses.

It should be understood that various example embodiments described herein should be considered in a descriptive sense only and not for purposes of limitation. Descriptions of features or aspects within each embodiment should typically be considered as available for other similar features or aspects in other embodiments. Example embodiments are not necessarily mutually exclusive with one another. For example, some example embodiments may include features described with reference to one or more figures, and may also include features described with reference to one or more other figures. While one or more embodiments have been described with reference to the figures, it will be understood by those of ordinary skill in the art that various changes in form and details may be made therein without departing from the spirit and scope as defined by the following claims.

What is claimed is:

1. A thin film structure comprising:
   a substrate; and a ferroelectric layer on the substrate and comprising a compound having a fluorite structure in which a <001> crystal direction is aligned along a normal direction of the substrate, the ferroelectric layer having an orthorhombic phase and comprising fluorine, wherein an uppermost atomic layer of the ferroelectric layer includes fluorine.

2. The thin film structure of claim 1,
wherein the ferroelectric layer comprises the compound having the fluorite structure where a <001> crystal direction is a dominant ratio in the ferroelectric layer.

3. The thin film structure of claim 1,
wherein the ferroelectric layer comprises the compound having the fluorite structure where crystal grains having a <001> crystal direction aligned along a normal direction of the substrate in an amount of about 20 weight % or more in the ferroelectric layer.

4. The thin film structure of claim 1,
wherein the ferroelectric layer has ferroelectricity.

5. The thin film structure of claim 1,
wherein an amount of the orthorhombic phase in the compound having the fluorite structure is at least about 50%.

6. The thin film structure of claim 1,
wherein the ferroelectric layer comprises a compound fluorite structure represented by Formula 1:

$$MO_{2-\varepsilon}F_\alpha X_\beta \qquad \text{Formula 1}$$

wherein, in Formula 1, M is Hf, Zr, or a combination of Hf and Zr, X is O, N, H, or a combination of O, N, or H, $0<\alpha\leq 1$ and $0\leq\beta\leq 1$, wherein the sum of $\alpha$ and $\beta$ is about 1 or less, and $0\leq\varepsilon\leq 1$.

7. The thin film structure of claim 1,
wherein the ferroelectric layer further comprises a dopant material selected from the group including C, Si, Ge, Sn, Pb, Al, Y, La, Gd, Mg, Ca, Sr, Ba, Ti.

8. The thin film structure of claim 7,
wherein the ferroelectric layer comprises the compound having the fluorite structure represented by Formula 1, wherein an amount of the dopant material is in a range of greater than 0 atom % (at %) to about 20 at % of an amount of M:

$$MO_{2-\varepsilon}F_\alpha X_\beta \qquad \text{Formula 1}$$

wherein, in Formula 1, M is Hf, Zr, or a combination of Hf and Zr, X is O, N, H, or a combination of O, N, or H, $0<\alpha\leq 1$ and $0\leq\beta\leq 1$, wherein the sum of a and B is about 1 or less, and $0\leq\varepsilon\leq 1$.

9. The thin film structure of claim 1,
wherein a thickness of the ferroelectric layer is in a range of about 0.1 nm or more to about 10 nm or less.

10. The thin film structure of claim 1,
wherein the ferroelectric layer comprises a first region and a second region,
the first region comprises a first compound having the fluorite structure represented by Formula 1-1, and
the second region comprises a second compound having the fluorite structure represented by Formula 1-2:

$$MO_{2-\zeta}F_{\gamma 1}X_{\gamma 2} \qquad \text{Formula 1-1}$$

$$MO_{2-\eta}F_{\delta 1}X_{\delta 2} \qquad \text{Formula 1-2}$$

wherein, in Formulae 1-1 and 1-2, M is Hf, Zr, or a combination of Hf and Zr; X is O, N, H, or a combination of O, N, or H; $0<\gamma 1\leq 1$ and $0\leq\gamma 2\leq 1$, wherein the sum of $\gamma 1$ and $\gamma 2$ is about 1 or less, and $0\leq\zeta\leq 1$; $0\leq\delta 1\leq 1$ and $0\leq\delta 2\leq 1$, wherein the sum of $\delta 1$ and $\delta 2$ is about 1 or less, and $0\leq\eta\leq 1$; And $\gamma 1$ and $\delta 1$ are different from each other.

11. The thin film structure of claim 10,
wherein $\gamma 1>\delta 1$.

12. The thin film structure of claim 10,
wherein $\delta 1$ is about 0.1 or less, and $\gamma 1$ is in a range of about 0.1 or more to about 0.95 or less.

13. The thin film structure of claim 10,
wherein at least one of
the second region is between the substrate and the first region,
or the first region is located the substrate and the second region.

14. A semiconductor device comprising the thin film structure of claim 1; and
at least one active or passive device.

15. The semiconductor device of claim 14 comprising:
a first electrode; and
a second electrode apart from the first electrode,
wherein the ferroelectric layer is between the first electrode and the second electrode, and
at least one of the first electrode or the second electrode corresponds to the substrate.

16. The semiconductor device of claim 15, further comprising:
a dielectric layer comprising a paraelectric material.

17. The semiconductor device of claim 16,
wherein the dielectric layer is between the ferroelectric layer and the substrate.

18. The semiconductor device of claim 15,
wherein one of the first electrode and the second electrode comprises a semiconductor material.

19. The semiconductor device of claim 18,
wherein the one of the first electrode and the second electrode comprising a semiconductor material comprises a source and a drain.

20. A semiconductor apparatus comprising the semiconductor device of claim 14; and
at least one active or passive device.

21. A transistor comprising:
a substrate;
a source/drain region in the substrate; and
a ferroelectric layer on the substrate and between the source/drain region, the ferroelectric layer comprising a fluorine compound in an orthorhombic phase, the fluorine compound being a compound in which a <001> crystal direction is aligned along a normal direction of the substrate, wherein an uppermost atomic layer of the ferroelectric layer includes fluorine.

22. The transistor of claim 21, further comprising:
a halo region in the substrate, the halo region having a conductivity type opposite to a conductivity type of the source/drain region.

23. The transistor of claim 22, wherein a concentration of impurities in the halo region is less than a concentration of impurities in the source/drain region.

24. The transistor of claim 21, further comprising:
a gate electrode on the ferroelectric layer, wherein
a thickness of the gate electrode is less than a thickness of the ferroelectric layer.

25. The thin film structure of claim 1, wherein at least one orthorhombic unit cell of the orthorhombic is arranged in the <001> crystal direction with a fluorite structure consisting of one element of a metal and two elements of fluorine.

* * * * *